United States Patent

Wu et al.

[11] Patent Number: 6,037,807
[45] Date of Patent: Mar. 14, 2000

[54] SYNCHRONOUS SENSE AMPLIFIER WITH TEMPERATURE AND VOLTAGE COMPENSATED TRANSLATOR

[75] Inventors: Chau-Chin Wu; Ta-Ke Tien, both of Cupertino; Wen-Kuan Fang, San Jose, all of Calif.

[73] Assignee: Integrated Device Technology, Inc., Santa Clara, Calif.

[21] Appl. No.: 09/080,710

[22] Filed: May 18, 1998

[51] Int. Cl.[7] .............................. G11C 7/06; H01L 35/00
[52] U.S. Cl. ........................... 327/52; 327/513; 327/362
[58] Field of Search ................................. 327/51–57, 63, 327/65, 66, 67, 77, 83, 89, 362, 513, 560–563

[56] References Cited

U.S. PATENT DOCUMENTS

| | | | |
|---|---|---|---|
| 4,261,044 | 4/1981 | Closson et al. | 365/8 |
| 4,644,306 | 2/1987 | Kleinberg | 327/561 |
| 5,734,272 | 3/1998 | Belot et al. | 327/65 |
| 5,801,584 | 9/1998 | Mori | 327/513 |
| 5,856,749 | 1/1999 | Wu | 327/66 |

*Primary Examiner*—Toan Tran
*Attorney, Agent, or Firm*—Bever & Hoffman

[57] ABSTRACT

A bias control circuit for controlling the bias current in a sense amplifier circuit. The bias control circuit maintains a substantially constant bias current when the $V_{CC}$ supply voltage decreases, thereby maintaining the operating speed of the sense amplifier circuit at a predetermined level. The bias control circuit also increases the bias current as the temperature of the sense amplifier circuit increases, thereby maintaining the operating speed of the sense amplifier circuit at the predetermined level. Furthermore, the bias circuit controls the logic low voltage provided by the sense amplifier circuit to be less than a predetermined threshold value, even as the $V_{CC}$ supply voltage increases.

10 Claims, 4 Drawing Sheets

SYNCHRONOUS SENSE AMPLIFIER WITH TEMPERATURE AND VOLTAGE COMPENSATED TRANSLATOR

BACKGROUND OF THE INVENTION

1. Field of the Invention

The present invention relates to a circuit which provides current compensation for a sense amplifier for variations in both temperature and supply voltage.

2. Discussion of Related Art

FIG. 1 is a schematic diagram of a conventional sense amplifier 100 which is coupled to an output inverter 110. Sense amplifier 100 includes p-channel field effect transistors (FETs) 101–102, n-channel FETs 103–105, input terminals 106–107, node 109 and output terminal 108. P-channel FET 101 and n-channel FETs 103 and 105 are connected in series between the $V_{CC}$ voltage supply terminal and the ground voltage supply terminal as illustrated. Similarly, p-channel FET 102 and n-channel FETs 104 and 105 are connected in series between the $V_{CC}$ voltage supply terminal and the ground voltage supply terminal as illustrated. Input terminals 106 and 107 are coupled to complementary bit lines (not shown), thereby receiving complementary signals IN_1 and IN_2. The $V_{CC}$ supply voltage is applied to the gate of n-channel FET 105 to enable sense amplifier circuit 100. The output terminal 108 is coupled to provide an output voltage $V_{OUT}$ to inverter 110. Inverter 110 is a conventional circuit which includes p-channel FET 111 and n-channel FET 112.

The current flowing through n-channel FET 105 is the bias current ($I_{BIAS}$) of sense amplifier 100. As the bias current through n-channel FET 105 is reduced, the speed of sense amplifier 100 is reduced, thereby resulting in a relatively slow sense amplifier 100. Moreover, as the conductivity of n-channel FETs 103 and 104 decrease, sense amplifier 100 becomes slower. Variations in the $V_{CC}$ supply voltage and the temperature can undesirably reduce the bias current through n-channel FET 105 and decrease the conductivity of n-channel FETs 103 and 104.

More specifically, if the actual $V_{CC}$ supply voltage is lower than the specified $V_{CC}$ supply voltage (e.g., the actual $V_{CC}$ supply voltage is 3.0 Volts, and the specified $V_{CC}$ supply voltage is 3.3 Volts), then the gate-to-source voltage ($V_{GS}$) of FET 105 can have a relatively low value. As the $V_{GS}$ voltage of FET 105 decreases, the bias current through n-channel FET 105 decreases, thereby causing sense amplifier 100 to become slower.

Moreover, as the temperature of sense amplifier 100 increases, the conductivity of FETs 103, 104 and 105 decrease. As the conductivity of n-channel FET 105 decreases, the bias current through n-channel FET 105 decreases, thereby causing sense amplifier 100 to become slower. As the conductivity of n-channel FETs 103 and 104 decrease, sense amplifier 100 becomes slower.

Another shortcoming of sense amplifier 100 is that as the $V_{CC}$ supply voltage increases, the input voltages IN_1 and IN_2 increase (since these input voltages track with the $V_{CC}$ supply voltage). As a result, the voltage on node 109 ($V_{109}$) increases. When the input voltage IN_2 is greater than the input voltage IN_1, the output voltage $V_{OUT}$ has a logic low output voltage $V_{OL}$. This logic low output voltage $V_{OL}$ is approximately equal to the voltage on node 109, $V_{109}$. Thus, when the $V_{CC}$ supply voltage has a high value (e.g., the actual $V_{CC}$ supply voltage is 3.6 Volts, and the specified $V_{CC}$ supply voltage is 3.3 Volts), then the voltages $V_{109}$ and $V_{OL}$ have relatively high values. A relatively high logic low output voltage $V_{OL}$ reduces the noise margin of sense amplifier 300 as follows. The logic low output voltage $V_{OL}$ must be able to drive inverter 110. If the logic low output voltage $V_{OL}$ is too high, it may be insufficient to drive inverter 110 in the desired manner. More specifically, if the logic low output voltage $V_{OL}$ is too high, p-channel FET 111 of inverter 110 may turn off, and n-channel FET 112 of inverter 110 may turn on. It is therefore desirable to maintain the logic low output voltage $V_{OL}$ at a voltage which is less than the threshold voltage of n-channel FET 112. Stated another way, it is desirable to increase the noise margin of sense amplifier 100.

FIG. 2 is a circuit diagram of a conventional sense amplifier 200 which is similar to sense amplifier 100 (FIG. 1). Because sense amplifier 200 is similar to sense amplifier 100 (FIG. 1), similar elements in FIGS. 1 and 2 are labeled with similar reference numbers. In sense amplifier 200, the gate of n-channel FET 105 is connected to receive a constant reference voltage $V_{REF}$, rather than the $V_{CC}$ supply voltage.

As described above, the logic low output voltage $V_{OL}$ cannot be allowed to get too high. The highest logic low output voltage $V_{OL}$ occurs when the $V_{CC}$ supply voltage is at a high level. As the $V_{CC}$ supply voltage increases, the IN_1, IN_2 and $V_{109}$ voltages increase in the manner described above, thereby increasing the logic low output voltage $V_{OL}$. As described above, this causes the noise margin of sense amplifier 200 to decrease. However, in sense amplifier 200, the voltage applied to the gate of FET 105 does not increase with the increasing $V_{CC}$ supply voltage. As a result, a high $V_{CC}$ supply voltage results in an even higher logic low output voltage $V_{OL}$ than in sense amplifier 100. In order to minimize this problem, the elements of sense amplifier 200 are designed to minimize the voltage $V_{109}$ when the $V_{CC}$ supply voltage is high.

However, such a design causes the voltage $V_{109}$ to be extremely low at low $V_{CC}$ supply voltages. As a result, at low $V_{CC}$ supply voltages, n-channel FET 105 can enter the linear operating region, which causes the bias current ($I_{BIAS}$) to decrease significantly, thereby seriously slowing down sense amplifier 200.

Moreover, for high temperatures, the conductivity of n-channel FETs 103, 104 and 105 decrease, thereby causing sense amplifier 200 to slow down in the manner described above for sense amplifier 100.

Accordingly, it would be advantageous to have a circuit for maintaining the bias current of a sense amplifier at appropriate levels in the presence of variations in both temperature and $V_{CC}$ supply voltage.

SUMMARY

Accordingly, the present invention provides a bias control circuit that controls the bias current in a sense amplifier circuit. The bias control circuit maintains a substantially constant bias current when the $V_{CC}$ supply voltage decreases, thereby maintaining the operating speed of the sense amplifier circuit at a predetermined level. The bias control circuit also increases the bias current as the temperature of the sense amplifier circuit increases, thereby maintaining the operating speed of the sense amplifier circuit at the predetermined level. Furthermore, the bias control circuit limits the logic low voltage provided by the sense amplifier circuit to be less than a predetermined threshold value, even as the $V_{CC}$ supply voltage increases. As a result, the noise margin of the sense amplifier circuit is maintained at an acceptable level.

In one embodiment, the bias control circuit includes a differential amplifier which has a first input terminal coupled to receive a voltage $V_1$ which has a positive slope with respect to temperature. The differential amplifier also has a second input terminal which is coupled to receive a reference voltage $V_{REF}$. In one embodiment, a voltage divider circuit, which is coupled between a $V_{CC}$ voltage supply terminal and a ground supply terminal, generates the reference voltage $V_{REF}$.

The differential amplifier generates an output voltage $V_2$, which is inversely related to the voltage $V_1$. A feedback circuit, which is coupled to receive the output voltage $V_2$, provides a feedback current to the second input terminal of the differential amplifier in response to the output voltage $V_2$. The feedback current is inversely related to the output voltage $V_2$. As a result, the feedback current is directly related to the temperature. That is, as the temperature increases, the feedback current increases.

The feedback current is also inversely related to the $V_{CC}$ supply voltage. That is, as the $V_{CC}$ supply voltage decreases, the feedback current increases.

The feedback current is translated from the feedback circuit to the sense amplifier circuit, thereby supplying the bias current for the sense amplifier circuit. In one embodiment, the feedback current is translated to the sense amplifier circuit using a series of current mirror circuits. As a result, the bias current increases as the temperature increases. In addition, the bias current is maintained at a substantially constant value as the $V_{CC}$ supply voltage decreases. As a result, there is no loss in speed in the sense amplifier circuit when the temperature increases and/or the $V_{CC}$ supply voltage decreases.

The current mirror circuit which translates the feedback current to the bias current can also include a relatively large transistor which clamps the logic low output voltage of the sense amplifier circuit to the threshold voltage of the large transistor. By clamping the logic low output voltage of the sense amplifier circuit, the noise margin of the sense amplifier circuit is maintained at an acceptable level, even for high $V_{CC}$ supply voltages.

The present invention will be more fully understood in view of the following description and drawings.

DETAILED DESCRIPTION

Figure 1:
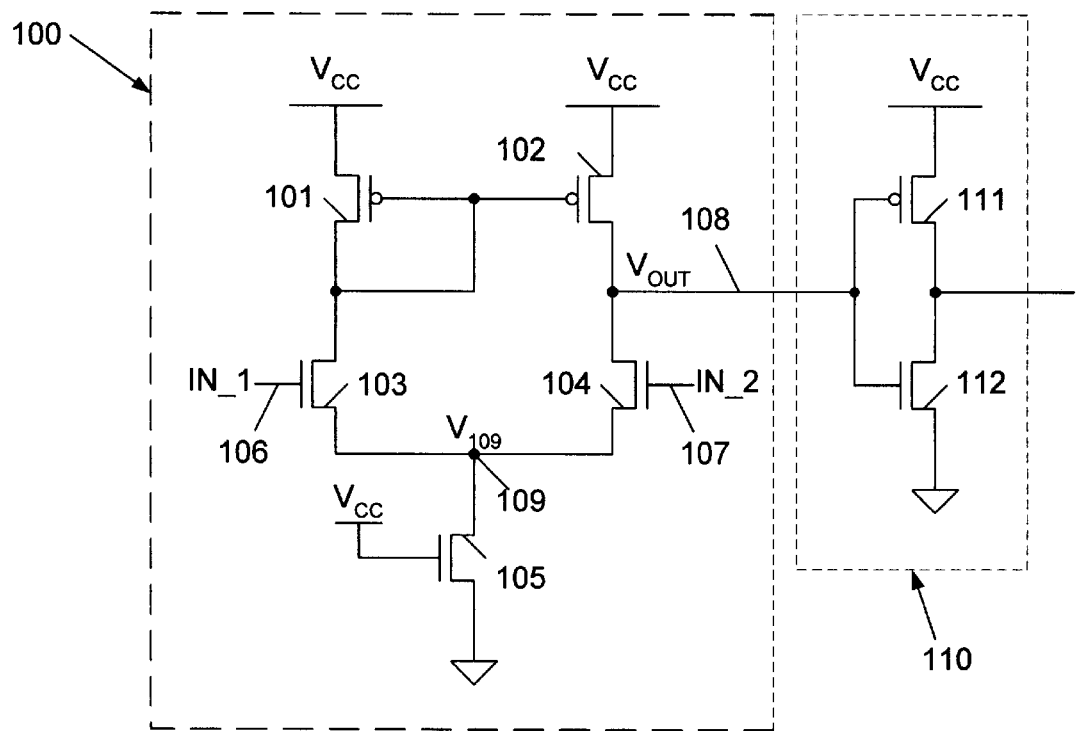
FIG. 1 is a circuit diagram of a conventional sense amplifier and inverter.
Figure 2:
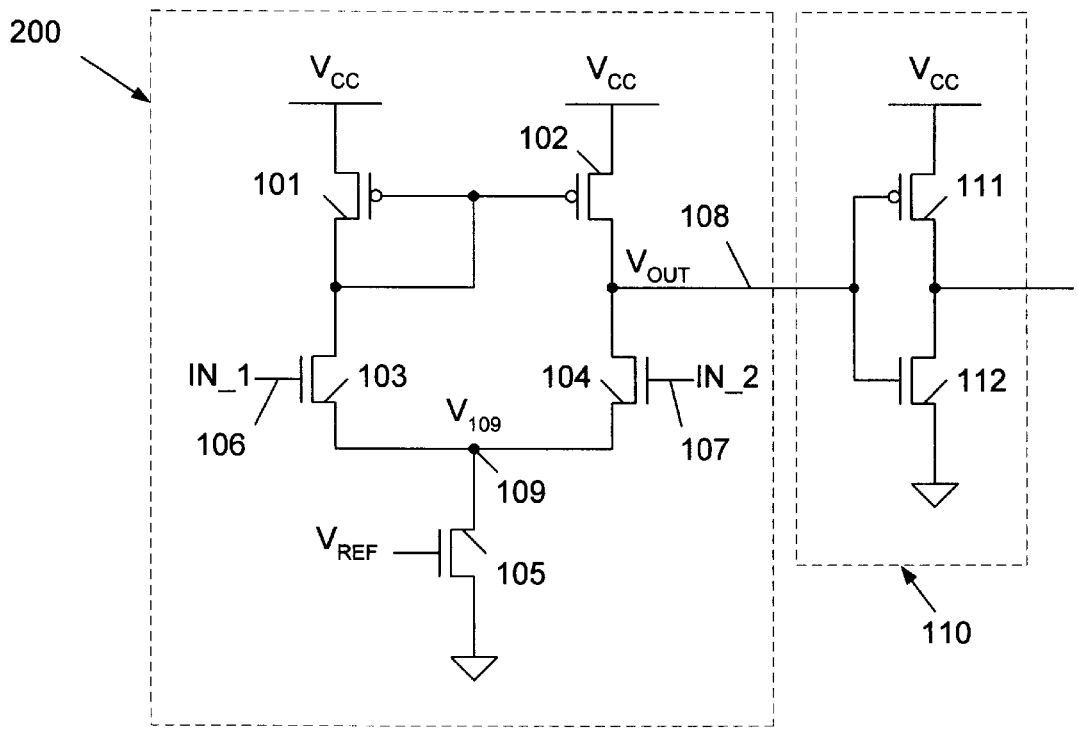
FIG. 2 is a circuit diagram of another conventional sense amplifier and inverter.
Figure 3:
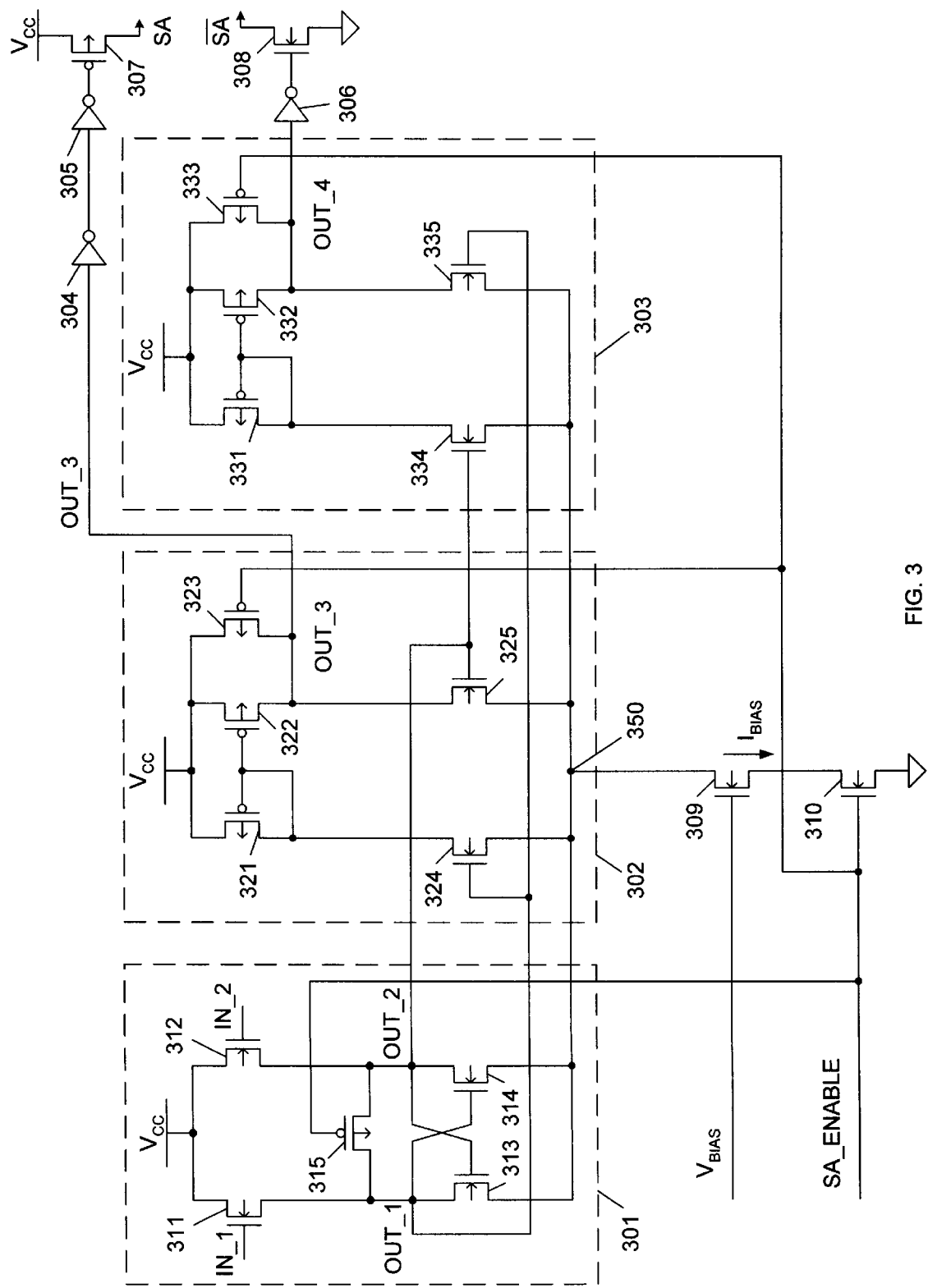
FIG. 3 is a circuit diagram of a sense amplifier in accordance with one embodiment of the present invention.

FIG. 3 is a circuit diagram of a sense amplifier circuit 300 which is used in one embodiment of the present invention. Sense amplifier circuit 300 includes a cross coupled amplifier 301, differential amplifier 302, differential amplifier 303, inverters 304–306, p-channel output FET 307, n-channel output FET 308, n-channel bias FET 309 and n-channel enable FET 310. Cross-coupled amplifier 301 includes n-channel FETs 311–314 and p-channel FET 315. Differential amplifier 302 includes p-channel FETs 321–323 and n-channel FETs 324–325. Differential amplifier 303 includes p-channel FETs 331–333 and n-channel FETs 334–335.

Within sense amplifier circuit 300, n-channel bias FET 309 and n-channel enable FET 310 are connected in series between node 350 and the ground supply terminal. Within cross-coupled amplifier 301, n-channel FETs 311 and 313 are connected in series between the $V_{CC}$ voltage supply terminal and node 350. Similarly, n-channel FETs 312 and 314 are connected in series between the $V_{CC}$ voltage supply terminal and node 350. FETs 311 and 312 are identical, and FETs 313 and 314 are identical. N-channel FETs 313 and 314 are cross-coupled, such that the drain of FET 313 is connected to the gate of FET 314, and the drain of FET 314 is connected to the gate of FET 313. P-channel FET 315 is connected across the drains of FETs 313 and 314 as illustrated. As described in more detail below, complementary input signals IN_1 and IN_2 are provided on bit lines to the gates of FETs 311 and 312, respectively. These input signals track the $V_{CC}$ supply voltage. In response to these input signals, cross-coupled amplifier 301 provides complementary output signals OUT_1 and OUT_2 at the drains of FETs 313 and 314, respectively.

The output signals OUT_1 and OUT_2 are provided to differential amplifiers 302 and 303 as illustrated. Within differential amplifier 302, p-channel FET 321 and n-channel FET 324 are connected in series between the $V_{CC}$ voltage supply terminal and node 350. Similarly, p-channel FET 322 and n-channel FET 325 are connected in series between the $V_{CC}$ voltage supply terminal and node 350. In the described embodiment, p-channel FETs 321 and 322 are identical, and n-channel FETs 324 and 325 are identical. The gates of p-channel FETs 321 and 322 are coupled to each other, and to the drain of p-channel FET 321. The gates of n-channel FETs 324 and 325 are coupled to receive the OUT_1 and OUT_2 signals, respectively. P-channel FET 323 is connected in parallel across p-channel FET 322. The drain of p-channel FET 322 provides an output signal OUT_3, which is routed through inverters 304 and 305 to the gate of p-channel output FET 307.

FETs 331–335 of differential amplifier 303 are configured in the same manner as FETs 321–325 of differential amplifier 302. In the described embodiment, FETs 331–335 are identical to FETs 321–325, respectively, such that differential amplifiers 302 and 303 are identical. However, the OUT_1 and OUT_2 signals are provided to differential amplifier 303 in a reversed order. That is, the gate of n-channel FET 334 is coupled to receive the OUT_2 signal, and the gate of n-channel FET 335 is coupled to receive the OUT_1 signal. The drain of p-channel FET 332 provides an output signal OUT_4, which is routed through inverter 306 to the gate of n-channel output FET 308.

In general, sense amplifier circuit 300 operates as follows. The sense enable signal, SA_ENABLE, is controlled to have a logic low level when sense amplifier circuit 300 is to be disabled. The SA_ENABLE signal is provided to the gates of n-channel FET 310 and p-channel FETs 315, 323 and 333. The logic low SA_ENABLE signal causes n-channel transistor 310 to turn off, thereby isolating node 350 from the ground supply terminal, and preventing bias current $I_{BIAS}$ from flowing from cross-coupled amplifier 301 and differential amplifiers 302 and 303 to the ground supply terminal. This effectively disables sense amplifier circuit 300. The logic low SA_ENABLE signal also turns on p-channel FETs 315, 323 and 333. The turned on FET 315 equalizes the voltages on the drains and gates of FETs 313 and 314, thereby pre-charging cross-coupled amplifier 301. The turned on FETs 323 and 333 connect inverters 304 and 306, respectively, to the $V_{CC}$ voltage supply terminal. As a result, output FETs 307 and 308 are turned off, thereby preventing the generation of sense amplifier output signals SA and SA bar.

The SA_ENABLE signal is asserted at a logic high level to enable sense amplifier circuit 300. The logic high SA_ENABLE signal turns on n-channel FET 310. A bias voltage $V_{BIAS}$, which is described in more detail below, is applied to the gate of n-channel FET 309, thereby turning on FET 309. As a result, a conductive path is provided between node 350 and the ground supply terminal. A bias current $I_{BIAS}$ flows from node 350 to the ground supply terminal. The logic high SA_ENABLE signal further turns off p-channel FETs 315, 323 and 333, thereby enabling cross-coupled amplifier 301 and differential amplifiers 302 and 303.

Once enabled, sense amplifier circuit 300 receives complementary input signals IN_1 and IN_2 on the gates of n-channel FETs 311 and 312, respectively. These input signals are latched by the cross-coupled FETs 313–314 and provided as the amplified output signals OUT_1 and OUT_2. The output signals OUT_1 and OUT_2, in turn, cause differential amplifier circuits 302 and 303 to generate output signals OUT_3 and OUT_4. The output signals OUT_3 and OUT_4 are complementary signals because the OUT_1 and OUT_2 signals are provided to differential amplifier circuits 302 and 303 in opposite configurations.

A brief description of the operation of differential amplifier circuit 302 follows. The operation of differential amplifier 303 is substantially identical. When the OUT_1 signal has a logic high value, n-channel FET 324 has a relatively low impedance, thereby providing a relatively low impedance current path through FETs 321, 324, 309 and 310. As a result, a relatively large current flows between the $V_{CC}$ voltage supply terminal and the ground supply terminal. FETs 321 and 322 are coupled to form a current mirror circuit, such that the same relatively large current flows through FETs 322, 325, 309 and 310. However, because n-channel FET 325 is biased with the logic low OUT_2 signal, FET 325 exhibits a relatively high impedance. A large voltage drop therefore exists across FET 325, thereby creating a logic high OUT_3 output signal.

Conversely, when the OUT_1 signal has a logic low value, n-channel FET 324 has a relatively high impedance, thereby providing a relatively high impedance current path through FETs 321, 324, 309 and 310. As a result, a relatively small current flows between the $V_{CC}$ voltage supply terminal and the ground supply terminal through FETs 321, 324, 309 and 310. This same relatively small current is reflected to the current path which includes FETs 322, 325, 309 and 310. Because n-channel FET 325 is biased with a logic high OUT_2 signal, FET 325 exhibits a relatively low impedance. A small voltage drop therefore exists across FET 325, thereby resulting in a logic low output signal OUT_3. The logic low output signal OUT_3 is approximately equal to the voltage on node 350.

Differential circuit 303 generates the output signal OUT_4 in the same manner that differential circuit 302 generates the output signal OUT_3. However, the reversed connections of the OUT_1 and OUT_2 signals to differential circuit 303 cause the OUT_4 signal to be the complement of the OUT_3 signal. The OUT_3 and OUT_4 signals control output FETs 307 and 308, respectively. Thus, when the OUT_3 and OUT_4 signals have high and low values, respectively, FET 307 is turned off and FET 308 is turned on, thereby providing a floating SA output signal and a logic low SA bar output signal. Conversely, when the OUT_3 and OUT_4 signals have low and high values, respectively, FET 307 is turned on and FET 308 is turned off, thereby providing a logic high SA output signal and a floating SA bar output signal.

The operating characteristics of sense amplifier circuit 300 (e.g., speed and power consumption) are dependent upon the bias current $I_{BIAS}$ flowing through FET 309 (and FET 310) and the voltage at node 350. In accordance with the present invention, a bias control circuit (FIGS. 4 and 5) is coupled to the gate of FET 309, thereby controlling the bias current $I_{BIAS}$ flowing through FET 309 and the voltage at node 350. In general, this bias control circuit increases the bias current $I_{BIAS}$ as the $V_{CC}$ supply voltage decreases, and increases the bias current $I_{BIAS}$ as the temperature increases. As a result, the speed of sense amplifier circuit 300 is held constant for a wide range of operating conditions. In addition, this bias control circuit maintains a relatively low voltage on node 350 when the $V_{CC}$ supply voltage increases. As a result, the logic low output voltages (OUT_3 and OUT_4) provided by sense amplifier circuit 300 advantageously remain at relatively low levels as the $V_{CC}$ supply voltage increases, thereby maintaining an acceptable noise margin in the sense amplifier circuit 300.

Figure 4:
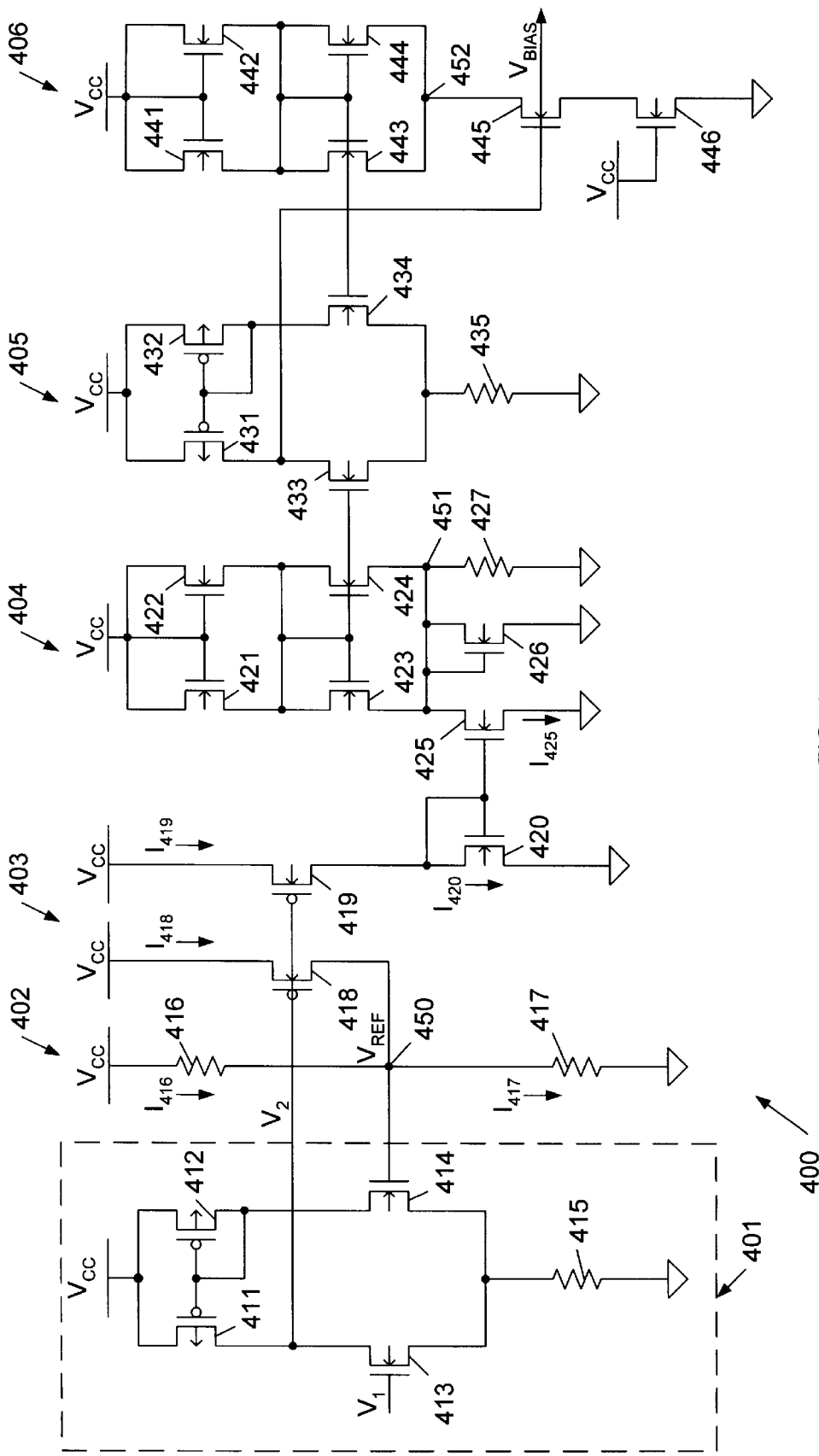
FIG. 4 is a circuit diagram of a bias control circuit for the sense amplifier of FIG. 3 in accordance with one embodiment of the present invention.

FIG. 4 is a circuit diagram of a bias control circuit 400 in accordance with one embodiment of the present invention. Bias control circuit 400 includes p-channel FETs 411–412, 418–419 and 431–432, n-channel FETs 413–414, 420–426, 433–434 and 441–446, and resistors 415–417, 427 and 435, which are connected as illustrated.

P-channel FETs 411–412, n-channel FETs 413–414 and resistor 415 are connected to form a high gain differential amplifier 401. Differential amplifier 401 receives a first input voltage $V_1$ at the gate of n-channel FET 413. As described in more detail below, the first input voltage $V_1$ increases as the temperature increases. However, the first input voltage $V_1$ is relatively insensitive to changes in the $V_{CC}$ supply voltage. The first input voltage $V_1$ is generated by a voltage control circuit 500, which is described in more detail below in connection with FIG. 5. Differential amplifier 401 also receives a second input voltage $V_{REF}$ on the gate of n-channel FET 414. The second input voltage $V_{REF}$ is generated by a voltage divider circuit 402 which is formed by connecting resistors 416 and 417 in series between the $V_{CC}$ voltage supply terminal and the ground supply terminal. In general, the second input voltage $V_{REF}$ follows the input voltage $V_1$. In response to the $V_1$ and $V_{REF}$ input voltages, differential amplifier 401 provides an output signal $V_2$ to the gates of p-channel FETs 418 and 419.

P-channel FETs 418 and 419, along with n-channel FET 420, form a current mirror circuit 403. P-channel FETs 418 and 419 are identically sized in the described embodiment. Because these FETs 418–419 are biased by the same signals, the same current flows in both FET 418 and FET 419. N-channel FET 420 is connected in series with p-channel FET 419. As a result, the same current flows in FETs 419 and 420. The gates of n-channel FETs 420 and 425 are commonly connected to the drain of n-channel FET 420, and the sources of n-channel FETs 420 and 425 are connected to the ground supply terminal. N-channel FETs 420 and 425 are identically sized. Because n-channel FETs 420 and 425 are biased in the same manner, the same current flows in both FET 420 and FET 425. These current relationships are summarized in equation (1) below.

$$I_{418}=I_{419}=I_{420}=I_{425} \quad (1)$$

where $I_{418}$, $I_{419}$, $I_{420}$ and $I_{425}$ are the currents flowing through FETs 418, 419, 420 and 425, respectively.

N-channel transistors 421–426 and resistor 427 are connected to form a first bias circuit 404. N-channel transistors 421 and 422 are identically sized, as are n-channel FETs 423 and 424. N-channel FETs 421 and 423 are connected in series between the $V_{CC}$ voltage supply terminal and node 451. Similarly, n-channel FETs 422 and 424 are connected in series between the $V_{CC}$ voltage supply terminal and node 451. The gates of n-channel FETs 421 and 422 are commonly connected to the $V_{CC}$ voltage supply terminal. The gates and drains of n-channel FETs 423 and 424 are commonly connected to one another, as well as to the gate of n-channel FET 433. N-channel FETs 425–426 and resistor 427 are connected in parallel between node 451 and the ground supply terminal. In general, the voltage on node 451 follows the $V_{CC}$ supply voltage.

N-channel transistors 441–446 are connected to form a second bias circuit 406, which is similar to the first bias circuit 404. N-channel FETs 441–444 are identical to n-channel FETs 421–424, respectively. The gates and drains of n-channel FETs 443 and 444 are commonly connected to one another, as well as to the gate of n-channel FET 434. N-channel FETs 445 and 446 are connected in series between node 452 and the ground supply terminal. N-channel FETs 445 and 446 are identical to FETs 309 and 310, respectively, of sense amplifier circuit 300. In general, the voltage on node 452 follows the $V_{CC}$ supply voltage.

P-channel FETs 431–432, n-channel FETs 433–434 and resistor 435 are connected to form a high gain differential amplifier 405. As described above, the gates of n-channel FETs 433 and 434 are connected to receive input voltages from bias circuits 404 and 406, respectively. In response to these input voltages, differential amplifier 405 provides the bias voltage $V_{BIAS}$ to the gate of n-channel FET 445, as well as to the gate of n-channel bias FET 309 of sense amplifier circuit 300 (FIG. 3).

In general, bias control circuit 400 operates as follows. Bias control circuit 400 generates the bias voltage $V_{BIAS}$, which is applied to the gate of n-channel bias FET 309 (FIG. 3), thereby controlling the bias current $I_{BIAS}$ flowing through FET 309. As described in more detail below, as the $V_{CC}$ supply voltage decreases, bias control circuit 400 causes the bias current $I_{BIAS}$ flowing through FET 309 to be maintained at a relatively constant level. As a result, the speed of the sense amplifier circuit 300 is maintained, even as the $V_{CC}$ supply voltage decreases.

A temperature sensitive control voltage $V_1$ is applied to bias control circuit 400. As described in more detail below, as the temperature increases, the control voltage $V_1$ increases. In response to this increase in control voltage $V_1$, bias control circuit 400 causes the bias current $I_{BIAS}$ flowing through FET 309 to be increased. As a result, the speed of sense amplifier circuit 300 is maintained, even as the temperature increases.

Thus, sense amplifier circuit 300 is adequately compensated when the temperature increases and/or the $V_{CC}$ supply voltage decreases.

In addition, bias control circuit 400 maintains the logic low output voltages of output signals OUT_3 and OUT_4 at acceptably low levels when the $V_{CC}$ supply voltage increases, thereby maintaining an acceptable noise margin within sense amplifier circuit 300.

The operation of bias control circuit 400 and sense amplifier circuit 300 will now be described in more detail. When the $V_{CC}$ supply voltage decreases, the input voltages IN_1 and IN_2 decrease (since these input voltages track the $V_{CC}$ supply voltage). As the input voltages IN_1 and IN_2 decrease, the voltage on node 350 also decreases. As a result, n-channel bias FET 309 enters the linear operating region, and the bias current $I_{BIAS}$ undesirably decreases. However, bias control circuit 400 compensates for this decrease in bias current as follows.

As the $V_{CC}$ supply voltage decreases, the reference voltage $V_{REF}$ at node 450 also tends to decrease. As the reference voltage $V_{REF}$ decreases, the current through n-channel FET 414 decreases. The current mirror circuit formed by FETs 411–414 causes the decrease in current through FET 414 to be translated as a decrease in current through FET 413. As the current through FET 413 decreases, the voltage $V_2$ decreases, thereby increasing the conductivity of p-channel FET 418. As a result, the current through p-channel FET 418 increases, thereby pulling the reference voltage $V_{REF}$ up toward the voltage $V_1$.

The currents through resistor 416, resistor 417 and p-channel FET 418 can be defined as follows.

$$I_{416}+I_{418}=I_{417} \quad (2)$$

Where $I_{416}$, $I_{417}$ and $I_{418}$ are the currents flowing through resistors 416, 417 and FET 418, respectively. Expanding equation (2) results in the following equation.

$$(V_{CC}-V_{REF})/R_{416}+I_{418}=V_{REF}/R_{417} \quad (3)$$

where $R_{416}$ and $R_{417}$ are the resistances of resistors 416 and 417, respectively.

Solving equation (3) for $I_{418}$ yields the following equation.

$$I_{418}=(1/R_{417}+1/R_{416})V_{REF}-V_{CC}/R_{416} \quad (4)$$

However, as described above in equation (1), $I_{418}=I_{425}$. Thus, equation (4) simplifies to the following equation.

$$I_{425}=(1/R_{417}+1/R_{416})V_{REF}-V_{CC}/R_{416} \quad (5)$$

Because $V_{REF}$ is insensitive to changes in the $V_{CC}$ supply voltage ($V_{REF}$ is pulled up to $V_1$ as described above), the current $I_{425}$ increases as the $V_{CC}$ supply voltage decreases.

Current $I_{425}$ is one of three currents flowing from node 451 to the ground supply voltage. Currents also flow through resistor 427 and n-channel FET 426. Resistor 427 is selected to supply a basic bias current for node 451 at all times during normal operation of the bias control circuit 400. N-channel FET 426 is a relatively large transistor which turns on when the voltage on node 451 exceeds the threshold voltage $V_{TN}$ of FET 426. Turned-on N-channel FET 426 clamps the voltage of node 451 at this threshold voltage $V_{TN}$.

As the current $I_{425}$ increases, the voltage of node 451 decreases. As a result, the voltage applied to the gate of n-channel FET 433 decreases, thereby causing the bias voltage $V_{BIAS}$ to increase. The increased bias voltage $V_{BIAS}$ is applied to the gate electrode of n-channel bias FET 309. As a result, the bias current $I_{BIAS}$ through FET 309 increases, thereby compensating for the reduction in bias current $I_{BIAS}$ which resulted from the low $V_{CC}$ supply voltage. The net effect is that the bias current $I_{BIAS}$ remains substantially constant as the $V_{CC}$ supply voltage decreases. This advantageously maintains the operation of sense amplifier circuit 300 at a constant speed.

Note that the bias voltage $V_{BIAS}$ is also applied to the gate of n-channel FET 445, thereby providing a feedback voltage that forces the voltage at node 452 to be equal to the voltage at node 451. Because transistors 421–424 of bias circuit 404 are identical to transistors 441–444 of bias circuit 406, the total current flowing from the $V_{CC}$ supply voltage terminal to node 451 is equal to the total current flowing from the $V_{CC}$ voltage supply terminal to node 452. As a result, the total current flowing from node 451 to the ground supply terminal through n-channel FETs 425–426 and resistor 427 is equal to the total current flowing from node 452 to the ground supply terminal through n-channel FETs 445 and 446. Moreover, because FETs 445 and 446 are biased in the same manner as FETs 309 and 310 (FIG. 3), the current flowing from node 452 to the ground voltage supply is mirrored to create the bias current $I_{BIAS}$ flowing from node 350 to the ground supply terminal (FIG. 3). In addition, the voltage at node 452 is mirrored to node 350. In other words, the total current flowing from node 451 to the ground supply terminal through n-channel FETs 425–426 and resistor 427 is translated to FETs 309 and 310 of sense amplifier circuit 300 as the bias current $I_{BIAS}$. Similarly, the voltage at node 451 is translated to nodes 452 and 350.

Bias control circuit 400 and compensation voltage source 500 (FIG. 5) also combine to provide compensation for high temperatures. As the temperature of sense amplifier circuit 300 increases, the conductivity of n-channel FETs 311–314, 324–325 and 334–335 decrease. As a result, the speed of sense amplifier circuit 300 slows down. However, as described in more detail below in connection with FIG. 5, as the temperature increases, the voltage $V_1$ provided by compensation voltage source 500 increases. The increased input voltage $V_1$ causes the reference voltage $V_{REF}$ to increase, without a corresponding increase in the $V_{CC}$ supply voltage. In accordance with equation (5), the increase in the reference voltage $V_{REF}$ results in a corresponding increase in current $I_{425}$. As described above, an increase in current $I_{425}$ results in an increase in the bias voltage $V_{BIAS}$, as well as an increase in the bias current $I_{BIAS}$. This increased bias current $I_{BIAS}$ increases the speed of sense amplifier circuit 300. The increase in speed resulting from the increased bias current $I_{BIAS}$ compensates for the decrease in speed resulting from the decreased conductivity of FETs 311–314, 324–325 and 334–335. The net effect is that the operating speed of sense amplifier 300 remains approximately the same, in spite of the increasing temperature.

Figure 5:
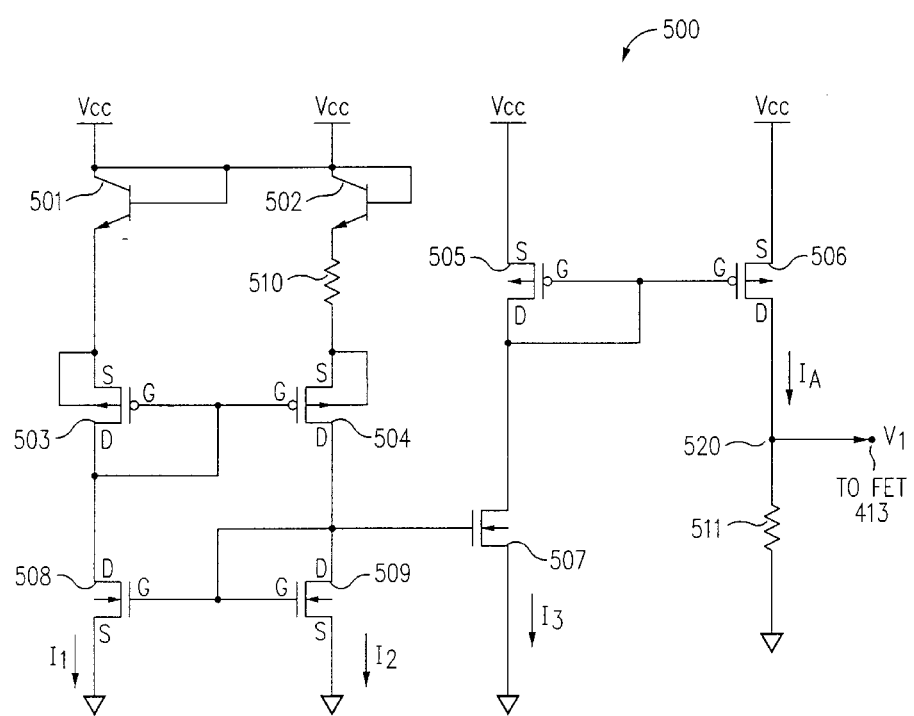
FIG. 5 is a circuit diagram of a compensation voltage source which generates a voltage having a positive slope with respect to temperature in accordance with one embodiment of the present invention.

FIG. 5 is a circuit diagram of a compensation voltage source 500 which generates voltage $V_1$ in accordance with one embodiment of the present invention. As described below, voltage $V_1$ has a positive slope with respect to temperature. Compensation voltage source 500 includes NPN bipolar transistors 501–502, p-channel FETs 503–506, n-channel FETs 507–509 and resistors 510–511. NPN bipolar transistor 501, p-channel FET 503 and n-channel FET 508 are connected in series between the $V_{CC}$ voltage supply terminal and the ground voltage supply terminal. Similarly, NPN bipolar transistor 502, resistor 510, p-channel FET 504 and n-channel FET 509 are connected in series between the $V_{CC}$ voltage supply terminal and the ground voltage supply terminal. The bases of bipolar transistors 501 and 502 are coupled to the $V_{CC}$ voltage supply terminal. The substrates of p-channel FETs 503 and 504 are coupled to their respective sources. The drain of p-channel FET 503 is coupled to the gates of p-channel FETs 503 and 504. The drain of n-channel FET 509 is coupled to the gates of n-channel transistors 507, 508 and 509. P-channel FET 505 and n-channel FET 507 are connected in series between the $V_{CC}$ voltage supply terminal and the ground voltage supply terminal. P-channel FET 506 and resistor 511 are connected in series between the $V_{CC}$ voltage supply terminal and the ground supply terminal. The drain of FET 506 is connected to resistor 511 at node 520, which in turn is coupled to the gate of FET 413 (FIG. 4). The voltage $V_1$ is provided on output node 520. The drain of p-channel FET 505 is coupled to the gates of p-channel FETs 505 and 506. As mentioned above, compensation voltage source 500 provides a compensation voltage $V_1$ which has a positive slope with respect to temperature. Compensation voltage source 500 operates as follows. N-channel FETs 508 and 509 are identical. Because the gates of these n-channel FETs 508 and 509 are biased by the same signal, these transistors have the same gate-to-source voltages, and therefore carry the same current. The currents through n-channel FETs 508 and 509 are labeled as currents $I_1$ and $I_2$, respectively. N-channel FETs 508 and 509, being identical transistors which carry equal currents, have identical drain-to-source voltages.

P-channel FETs 503 and 504 are also identical. Because p-channel FETs 503 and 504 carry identical currents (i.e., $I_1$ and $I_2$ respectively) and the gates of p-channel FETs 503 and 504 are biased by the same signal, these transistors have the same drain-to-source voltages. As a result, the voltage at the source of p-channel FET 503 is equal to the voltage at the source of p-channel FET 504. The voltage across the base and emitter of NPN bipolar transistor 501 ($V_{BE501}$) is therefore equal to the voltage across the base and emitter of bipolar transistor 502 ($V_{BE502}$) plus the voltage drop across resistor 510 ($I_2R$). This equation is set forth below.

$$V_{BE501}=V_{BE502}+I_2R \quad (6)$$

Equation (6) can be re-written as follows.

$$I_2=(V_{BE501}-V_{BE502})/R \quad (7)$$

The general equation for the base-to-emitter voltage of an NPN bipolar transistor is:

$$V_{BE}=KT/q \ \ln(J_C/AT^\gamma)+V_{GO}, \quad (8)$$

Where K is Boltzmann's constant ($1.381\times10^{-23}$J/° K), T is the temperature of the transistor in ° K, q is the magnitude of electronic charge ($1.6\times10^{-19}$ C), $J_C$ is the collector current density in A/m², A is a temperature independent constant, $\gamma$ is a temperature coefficient, and $V_{GO}$ is the bandgap voltage.

Equations (7) and (8) can be combined to form the following equation.

$$I_2=[(KT/q \ \ln(J_{C1}/A_1T^\gamma)+V_{GO})-(KT/q \ \ln(J_{C2}/A_2T^\gamma)+V_{GO})]/R \quad (9)$$

Because the temperature independent constants A, $V_{GO}$ and $\gamma$ are the same for bipolar transistors 501 and 502, the following equation is obtained.

$$I_2[KT/q \ \ln(J_{C1}/J_{C2})]/R \quad (10)$$

Because current density (J) is equal to current (I) divided by area (A), equation (10) can be modified to obtain equation (11).

$$I_2=[KT/q \ \ln((I_1/A_{E1})/(I_2/A_{E2}))]/R \quad (11)$$

Where $A_{E1}$ and $A_{E2}$ are the emitter areas of transistors 501 and 502, respectively. Because I1=I2, equation (11) reduces to the following equation.

$$I_2=[KT/q \ \ln(A_{E2}/A_{E1})]/R \quad (12)$$

Taking the derivative of equation (12) with respect to temperature T results in the following equation.

$$\partial I_2/\partial T=[K/q \ \ln(A_{E2}/A_{E1})]/R \quad (13)$$

A positive temperature dependence is obtained (i.e., $\partial I_2/\partial T$ is positive) if $A_{E2}$ is greater than $A_{E1}$. Transistors 501 and 502 are therefore designed such that $A_{E2}$ is greater than $A_{E1}$, thereby providing a positive temperature dependence for current $I_2$. As a result, when the temperature T increases, the current $I_2$ increases. Conversely, when the temperature decreases, the current $I_2$ decreases.

In the described embodiment, n-channel FET 507 is identical to n-channel transistors 508 and 509. Because n-channel FET 507 is biased with the same signal as n-channel FETs 508 and 509, a current mirror circuit is formed. As a result, the current $I_3$ flowing through n-channel FET 507 is equal to the currents $I_1$ and $I_2$ flowing through n-channel FETs 508 and 509.

Because n-channel FET 507 is connected in series with p-channel FET 505, the current $I_3$ also flows through P-channel FET 505. P-channel FET 505 is biased by the same signal as p-channel transistor 506, thereby forming a current mirror circuit. In one embodiment, p-channel FET 505 is identical to p-channel FET 506, thereby causing the compensation current $I_A$ flowing through p-channel FET 506 to be equal to the current $I_3$ flowing through p-channel FET 505. In other embodiments, p-channel FETs 505 and 506 are sized such that the resulting compensation current $I_A$ is weighted by a predetermined value.

Because the current $I_2$ is translated through current mirror circuits to create the compensation current $I_A$, the compensation current $I_A$, like the current $I_2$, has a positive temperature dependence. Because the voltage $V_1$ is proportional to the compensation current $I_A$, voltage $V_1$ also has a positive temperature dependence. Thus, when the temperature increases, the voltage $V_1$ increases.

As described above in connection with FIG. 4, when the voltage $V_1$ increases, the voltage $V_{REF}$ increases. In accordance with equation (5), when $V_{REF}$ increases, the current $I_{425}$ increases. As also described above, an increase in the current $I_{425}$ results in a corresponding increase in the bias voltage $V_{BIAS}$ and the bias current $I_{BIAS}$. As a result, the speed of the sense amplifier circuit 300 is maintained at desired levels, even when the temperature increases.

Bias control circuit 400 (FIG. 4) further provides compensation for high $V_{CC}$ supply voltages in the following manner. As the $V_{CC}$ supply voltage increases, the input voltages IN_1 and IN_2 increase (because these input voltages track the $V_{CC}$ supply voltage). As the input voltages IN_1 and IN_2 increase, the voltage on node 350 increases. As a result, the logic low output voltage levels of the output signals OUT_3 and OUT_4 increase. For example, if the input voltage IN_1 is greater than the input voltage IN_2, then the output voltage OUT_4 is at a logic low level which is approximately equal to the voltage of node 350. Conversely, if the input voltage IN_2 is greater than the input voltage IN_1, then the output voltage OUT_3 is at a logic low level which is approximately equal to the voltage of node 350. If the voltage of node 350 is allowed to be too high, then the logic low output voltages OUT_3 and OUT_4 may be too high to accurately activate inverters 304 and 306, respectively. Accordingly, bias control circuit 400 limits the voltage of node 350 as follows.

In bias control circuit 400, if the voltage on node 451 is greater than the threshold voltage $V_{TN}$ of n-channel FET 426, then FET 426 turns on. The voltage on node 451 will reach the threshold voltage $V_{TN}$ of FET 426 when the $V_{CC}$ supply voltage is relatively high. N-channel FET 426 is designed to carry a current large enough to clamp the voltage of node 451 to the threshold voltage $V_{TN}$ of FET 426. The large current drawn by FET 426 causes the bias voltage $V_{BIAS}$ to increase, thereby mirroring the large current to FET 309, and clamping node 350 to the threshold voltage $V_{TN}$ of FET 426. Clamping node 350 to the threshold voltage $V_{TN}$ of FET 426 ensures that the logic low levels of output voltages OUT_3 and OUT_4 are clamped to this threshold voltage $V_{TN}$, even for high $V_{CC}$ supply voltages. The threshold voltage $V_{TN}$ of FET 426 is selected such that this voltage $V_{TN}$ is low enough to drive inverters 304 and 306 in the desired manner. Stated another way, the threshold voltage $V_{TN}$ of FET 426 is selected to provide an adequate noise margin for sense amplifier circuit 300.

Although the present invention has been described in connection with several embodiments, it is understood that this invention is not limited to the embodiments disclosed, but is capable of various modifications which would be apparent to one of ordinary skill in the art. For example, although FETs 420 and 425 were described as being identically sized in the described embodiments, it is understood that these FETs can have various sizes relative to one another in view of the design of the other circuitry. Similarly, FETs 309 and 310 can have various sizes relative to FETs 425 and 426, respectively. Thus, the invention is limited only by the following claims.

We claim:

1. A circuit comprising:
   a sense amplifier circuit which operates in response to a $V_{CC}$ supply voltage, the sense amplifier circuit having an associated bias current; and
   a bias circuit coupled to the sense amplifier circuit, the bias circuit controlling the bias current to maintain an operating speed of the sense amplifier circuit when the $V_{CC}$ supply voltage decreases, and when the temperature of the circuit increases, wherein the bias circuit comprises circuitry for controlling a logic low voltage provided by the sense amplifier circuit to be less than a predetermined threshold value.

2. The circuit of claim 1, wherein the circuitry for controlling the logic low voltage comprises a transistor having a threshold voltage, wherein the transistor clamps the logic low voltage provided by the sense amplifier circuit to the threshold voltage.

3. A circuit comprising:
   a sense amplifier circuit which operates in response to a $V_{CC}$ supply voltage, the sense amplifier circuit having an associated bias current; and
   a bias circuit coupled to the sense amplifier circuit, the bias circuit controlling the bias current to maintain an operating speed of the sense amplifier circuit when the $V_{CC}$ supply voltage decreases, and when the temperature of the circuit increases, wherein the bias circuit comprises:
      a differential amplifier having a first input terminal coupled to receive a first control voltage having a positive slope with respect to temperature;
      a voltage divider circuit coupled to provide a reference voltage to a second input terminal of the differential amplifier;
      a feedback circuit coupled to an output terminal of the differential amplifier and the second input terminal of the differential amplifier, wherein the feedback circuit controls the reference voltage to be approximately equal to the first control voltage by varying a control current through the feedback circuit; and
      a translation circuit for translating variations in the control current into variations in the bias current.

4. The circuit of claim 3, wherein the feedback circuit comprises a transistor having a source coupled to receive the $V_{CC}$ supply voltage, a drain coupled to the second input terminal and a gate coupled to the output terminal of the differential amplifier.

5. The circuit of claim 3, wherein the voltage divider circuit comprises:

a first resistor having a first terminal coupled to receive the VCC supply voltage and a second terminal coupled to the second input terminal of the differential amplifier; and a second resistor having a first terminal coupled to the second input terminal of the differential amplifier and a second terminal coupled to a ground supply terminal.

6. The circuit of claim 3, wherein the translation circuit comprises at least one current mirror circuit.

7. The circuit of claim 3, further comprising a voltage compensation circuit coupled to the first input terminal of the differential amplifier, wherein the voltage compensation circuit is configured to provide a control voltage having a positive slope with respect to temperature.

8. The circuit of claim 1, wherein the sense amplifier circuit comprises:

a cross-coupled amplifier having a pair of output terminals;

a first differential amplifier having a pair of input terminals coupled to the output terminals of the cross-coupled amplifier in a first order; and a second differential amplifier having a pair of input terminals coupled to the output terminals of the cross-coupled amplifier in a second order which is reversed from the first order.

9. A method of operating a sense amplifier circuit, the method comprising the steps of:

operating the sense amplifier circuit in response to a $V_{CC}$ supply voltage;

biasing the sense amplifier circuit with an associated bias current;

maintaining the bias current at a predetermined level as the $V_{CC}$ supply voltage decreases, thereby maintaining a predetermined operating speed within the sense amplifier circuit;

increasing the bias current when the temperature of the sense amplifier circuit increases, thereby maintaining the predetermined operating speed within the sense amplifier circuit; and limiting a logic low output signal provided by the sense amplifier circuit to be lower than a predetermined threshold voltage, even as the $V_{CC}$ supply voltage increases.

10. A method of operating a sense amplifier circuit, the method comprising the steps of:

operating the sense amplifier circuit in response to a $V_{CC}$ supply voltage;

biasing the sense amplifier circuit with an associated bias current;

maintaining the bias current at a predetermined level as the $V_{CC}$ supply voltage decreases, thereby maintaining a predetermined operating speed within the sense amplifier circuit; and increasing the bias current when the temperature of the sense amplifier circuit increases, thereby maintaining the predetermined operating speed within the sense amplifier circuit, wherein the step of increasing the bias current further comprises the steps of:

applying a first voltage to a first input terminal of a differential amplifier, wherein the first voltage has a positive slope with respect to temperature;

applying a reference voltage to a second input terminal of the differential amplifier;

generating an output voltage with the differential amplifier, the output voltage being inversely related to the first voltage;

providing a feedback current to the second input terminal of the differential amplifier in response to the output voltage, wherein the feedback current is inversely related to the output voltage; and translating the feedback current to the sense amplifier circuit to generate the bias current.

\* \* \* \* \*